(12) United States Patent
Wan et al.

(10) Patent No.: US 7,454,319 B2
(45) Date of Patent: Nov. 18, 2008

(54) SYSTEM, METHOD, AND COMPUTER PROGRAM PRODUCT FOR DETERMINING WALL THICKNESS IN GRAPHIC MODEL

(76) Inventors: Jun Wan, 12937 Arabella Pl., Cerritos, CA (US) 90703; Chee-Keong Chong, 6 Salerno, Irvine, CA (US) 92614; Zhi Li, 8202 Gay St., Cypress, CA (US) 90630

( * ) Notice: Subject to any disclaimer, the term of this patent is extended or adjusted under 35 U.S.C. 154(b) by 713 days.

(21) Appl. No.: 10/717,273

(22) Filed: Nov. 19, 2003

(65) Prior Publication Data
US 2005/0107994 A1    May 19, 2005

(51) Int. Cl.
*G06K 9/36* (2006.01)
(52) U.S. Cl. .......................................... 703/1; 382/286
(58) Field of Classification Search .................... 703/1; 600/425; 700/118; 382/286
See application file for complete search history.

(56) References Cited

U.S. PATENT DOCUMENTS

| | | | | |
|---|---|---|---|---|
| 5,601,084 | A * | 2/1997 | Sheehan et al. | 600/450 |
| 5,896,303 | A * | 4/1999 | Furkay et al. | 703/2 |
| 6,366,800 | B1 * | 4/2002 | Vining et al. | 600/425 |
| 6,484,300 | B1 * | 11/2002 | Kim et al. | 716/7 |
| 6,557,388 | B1 * | 5/2003 | Mitsumaru et al. | 72/253.1 |
| 7,359,841 | B1 * | 4/2008 | Hixon | 703/2 |
| 2003/0088389 | A1 * | 5/2003 | Balaniuk et al. | 703/2 |
| 2004/0186604 | A1 * | 9/2004 | Onodera et al. | 700/97 |

OTHER PUBLICATIONS

Ryusuke Sagawa et al., "Effective Nearest Neighbor Search for Aligning and Merging Range Images", Proceedings of the Fourth International Conference on 3-D Digital Imaging and Modeling (3DIM'03), Oct. 6, 2003, pp. 79-86.

Jean Favre et al., "Ray Tracing with a Space-Filling Finite Element Mesh", International Journal for Numerical Methods in Engineering, vol. 37, Oct. 30, 1994, pp. 3571-3580.

Ying Liu et al., "Design and Evaluation of a Parallel HOP Clustering Algorithm for Cosmological Simulation", Proceedings of the International Parallel and Distributed Processing Symposium, Apr. 22, 2003, pp. 82-89.

J.K. Mukherjee, "AI Based Tele-Operation Support Through Voxel Based Workspace Modeling and Automated 3D Robot Path Determination", Conference on Convergent Technologies for the Asia-Pacific Region, vol. 4 of 4, Conf. 18, Oct. 15-17, 2003, pp. 305-309.

Yungching Huang et al., "Integrated Simulation, Error Assessment, and Tool Path Correction for Five-Axis NC Milling", Journal of Manufacturing Systems, vol. 14, No. 5, 1995, pp. 331-344.

Choong Hwan Lee et al., "Fast Volume Rendering using Adaptive Block Subdivision", Computer Graphics and Applications, Oct. 13, 1997, pp. 148-221.

(Continued)

*Primary Examiner*—Juan C Ochoa

(57) ABSTRACT

A system, method, and computer program product for measuring wall thickness. After an internal body topology of the model is generated, the topology is traversed between wall elements to determine wall thickness.

18 Claims, 13 Drawing Sheets

OTHER PUBLICATIONS

Huosheng Hu et al., "Coping with Uncertainty in Control and Planning for a Mobile Robot", IEEE/RS International Workshop on Intelligent Robots and Systems IROS, Nov. 3-5, 1991, pp. 1025-1030.

Volker Gaede et al., "Multidimensional Access Methods", ACM Computing Surveys, vol. 30, No. 2, Jun. 1998, pp. 170-231.

Li-Sheng Shen et al., "A Parallel Image-Rendering Algorithm and Architecture Based on Ray Tracing and Radiosity Shading", Computers and Graphics, vol. 19, No. 2, Mar. 1995, pp. 281-296.

* cited by examiner

SYSTEM, METHOD, AND COMPUTER PROGRAM PRODUCT FOR DETERMINING WALL THICKNESS IN GRAPHIC MODEL

TECHNICAL FIELD OF THE INVENTION

The present invention is directed, in general, to object modeling tools and processes.

BACKGROUND OF THE INVENTION

Computer-aided design and modeling (CAD/CAM) have become an integral part of the process for designing and manufacturing any number of components. By designing, modeling, and revising the components in a data processing system, the product can be visualized and optimized as it is being developed to ensure a correct design before any actual manufacturing takes place.

The ability to quickly modify the shape and dimensions of the modeled object is a great advantage during this process. In order to ensure that a product is properly modeled, every dimension must be verified.

Wall thickness check is an important and obvious requirement in product part design. But it is also an often neglected area due to limited availability of an efficient and robust application to perform this check. Wall thickness of a product is very critical in manufacturing and product quality for plastic part and casting part (e.g. engine) design. An efficient tool for automatically checking the wall thickness and finding the minimum and maximum wall thickness is in high demand. However, the current solutions in this area are far too much time consuming and without sufficient accuracy.

There is, therefore, a need in the art for a system, method, and computer program product for efficiently and accurately measuring wall thickness in a graphic model.

SUMMARY OF THE INVENTION

Disclosed is a system, method, and computer program product for measuring wall thickness. After an internal body topology of the model is generated, the topology is traversed between wall elements to determine wall thickness.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 14, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device. The numerous innovative teachings of the present application will be described with particular reference to the presently preferred embodiment.

Disclosed is a system, method, and computer program product for measuring wall thickness. After an internal body topology of the model is generated, the topology is traversed between wall elements to determine wall thickness.

Figure 1:
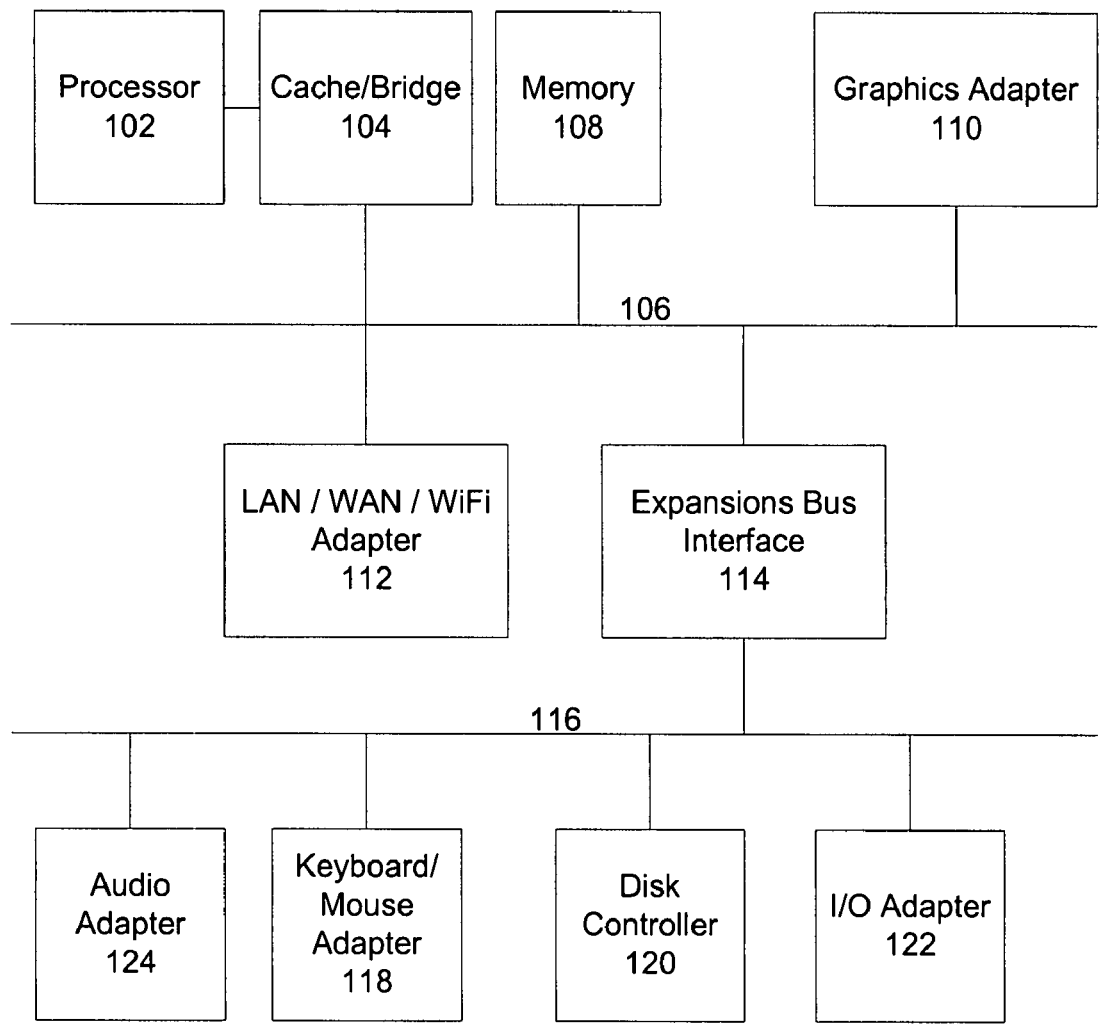
FIG. 1 depicts a block diagram of a data processing system in which a preferred embodiment can be implemented.

FIG. 1 depicts a block diagram of a data processing system in which a preferred embodiment can be implemented. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular. For example, other peripheral devices, such as an optical disk drive and the like, also may be used in addition or in place of the hardware depicted. The depicted example is provided for the purpose of explanation only and is not meant to imply architectural limitations with respect to the present invention.

A data processing system in accordance with a preferred embodiment of the present invention includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present invention as described.

Figure 2:
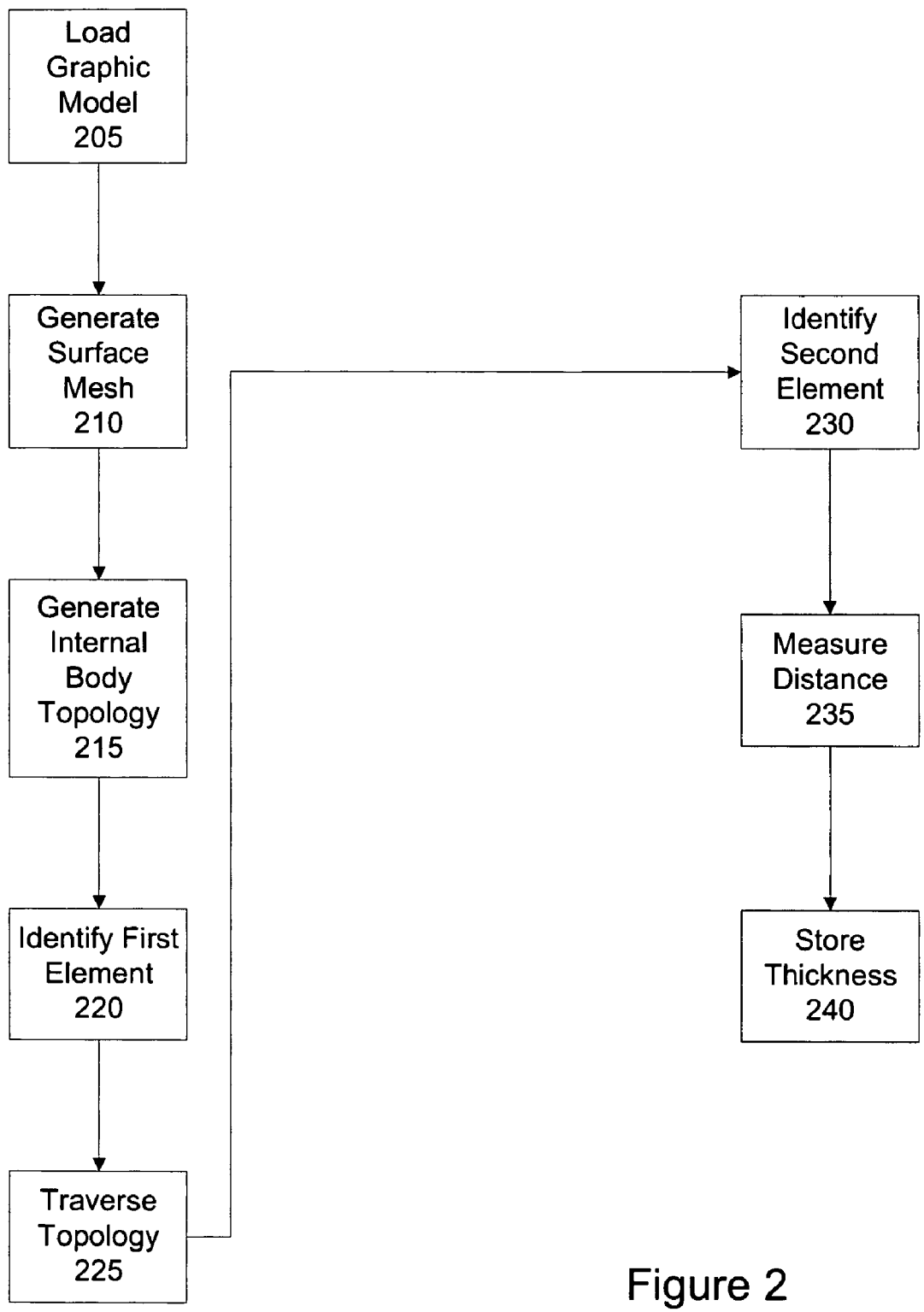
FIG. 2 depicts a flowchart of a process in accordance with a preferred embodiment.

FIG. 2 depicts a flowchart of a process for checking wall thickness in accordance with a preferred embodiment. A more detailed description of several steps appears below.

According to a preferred process, a graphic model is loaded in a data processing system (step 205). It is important to note that this can include loading a file that includes a specification of the model parameters, whether is or not the model is displayed to a user. Similarly, nothing is necessarily displayed to the user as other steps are performed.

Next, the system will generate a surface mesh on the faces of the model (step 210).

The system will then generate an internal body topology corresponding to the surface mesh (step 215).

The system will identify a first 2D element in a first wall side (step 220). Next, the system will traverse the internal body topology (step 225), until it identifies a second 2D element in a second wall side (step 230).

The system will then measure the distance between the first and second elements (step 235), thereby efficiently and accurately determining the wall thickness. The wall thickness, corresponding to the measured distance, is stored (step 240).

Figure 3:
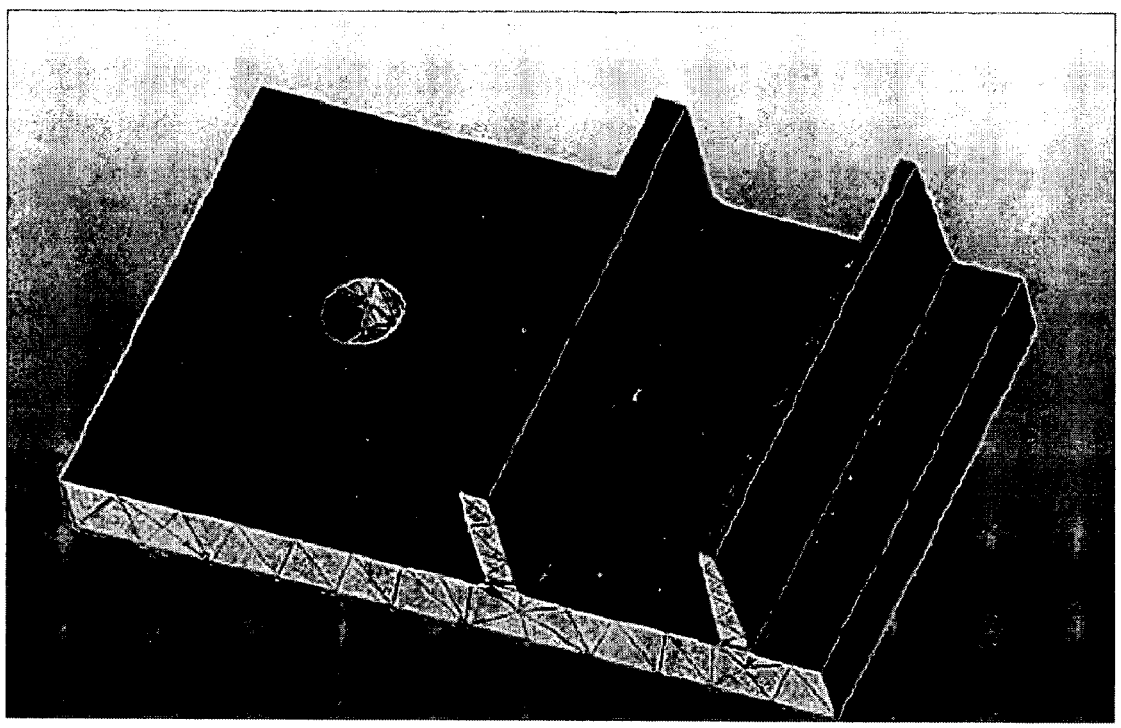
FIG. 3 depicts an exemplary 2D surface mesh result.

The step of generating the 2D surface mesh on the faces of the product model is performed using methods known to those of skill in the art. An exemplary 2D surface mesh result is shown in FIG. 3.

The thickness is then found, as described above, through measuring the distance between two small elements of the surface mesh on each side of the wall. The two elements are found by performing spatial traversal through the internal body topology from one element on the surface mesh to the other side of the wall. Since the spatial traversal is guided by the internal body topology, the spatial traversal can be assured that a shortest path is used.

According to at least some embodiments, two approaches are used for generating internal body topology. These are 3D volume meshing (tetrahedron type) and 3D grid mapping, both of which are known to those of skill in the art.

Figure 4:
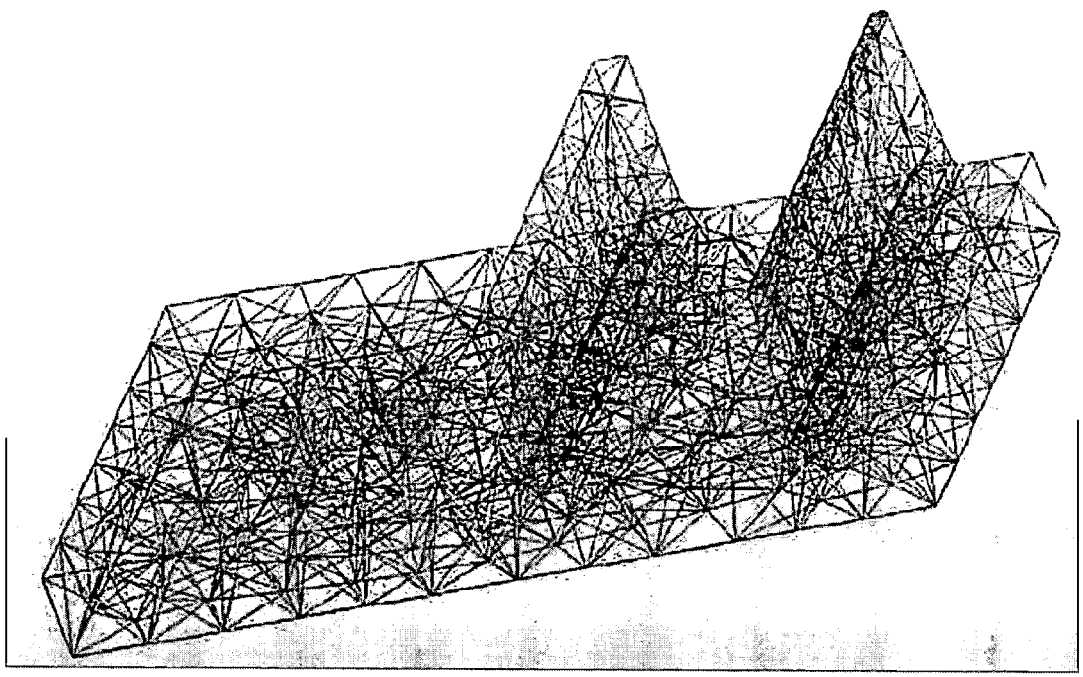
FIG. 4 depicts an exemplary 3D volume mesh result.

A 3D volume mesh will be generated after the 2D surface mesh has been generated. An exemplary 3D volume mesh result is shown in FIG. 4.

Figure 5:
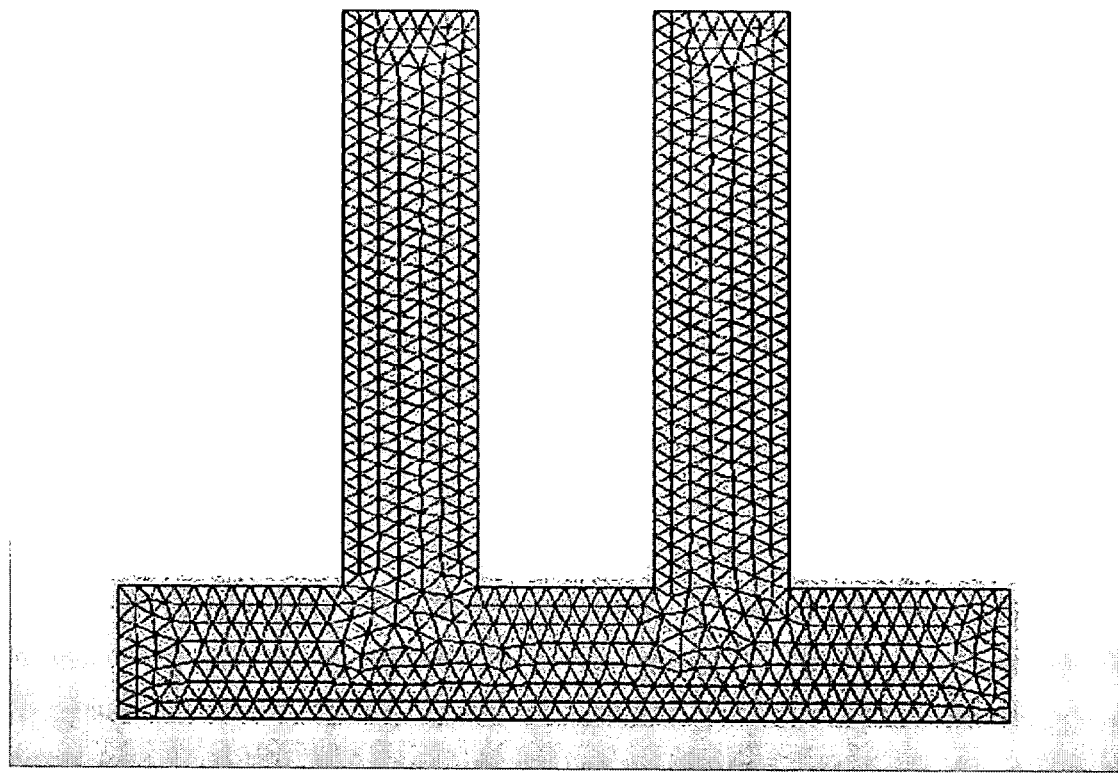
FIG. 5 depicts an exemplary section view from a 3D volume mesh result.

Traversing through the internal body topology method is to assure a shortest search path for finding two thickness 2D mesh elements. FIG. 5 is an exemplary section view from a 3D volume mesh result, corresponding to FIG. 4.

Figure 6:
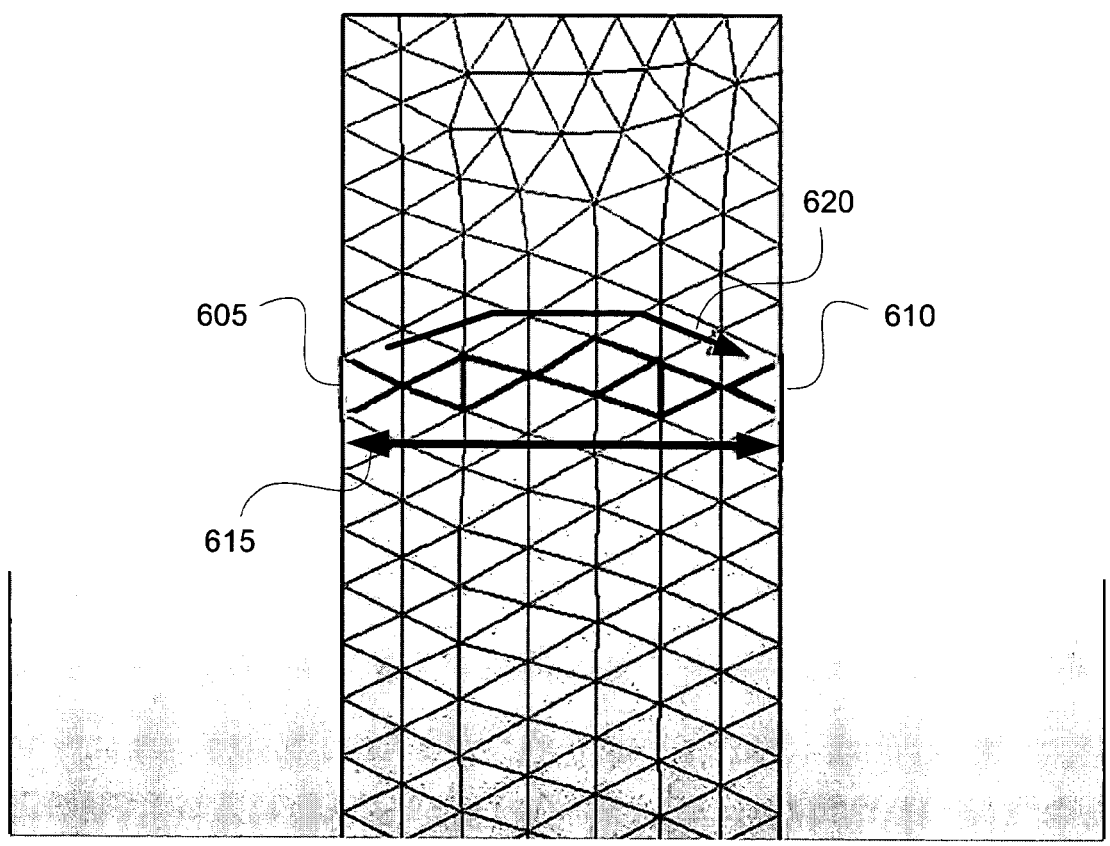
FIG. 6 depicts an example of traversing through a 3D volume mesh.

Traversing through the 3D volume mesh method is shown in FIG. 6. Guided by the face normal at a point projected from a point on the surface element 605, and the topology of the tetrahedral elements in the mesh, the thickness pair 2D surface elements 605 and 610 are found within the shortest path 620. The thickness 615 can then be measured.

3D grid mapping is another approach for generating the body internal topology. This approach is to create 3D grids for defining small cubes encompassing the product body conceptually. Each of the 2D surface mesh elements is then mapped into the corresponding cubes. All cubes that have association with any surface elements are maintained in a tree structure for efficient spatial traversal. An example of the 3D grid mapping approach is shown in FIG. 7.

Figure 7:
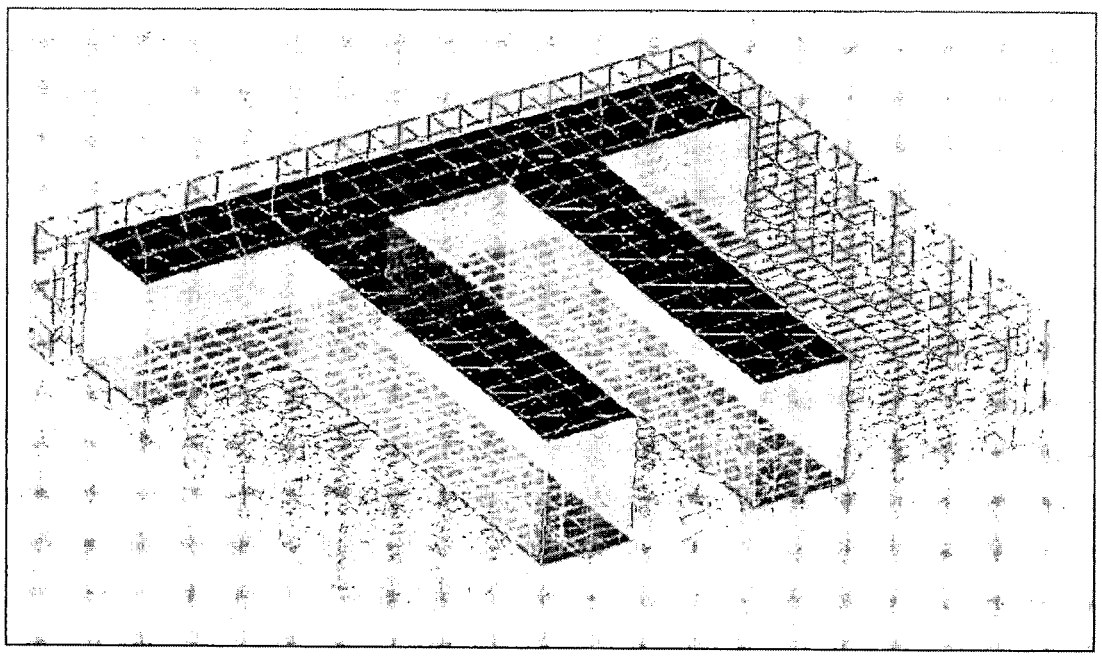
FIG. 7 depicts an example of the 3D grid mapping approach.
Figure 8:
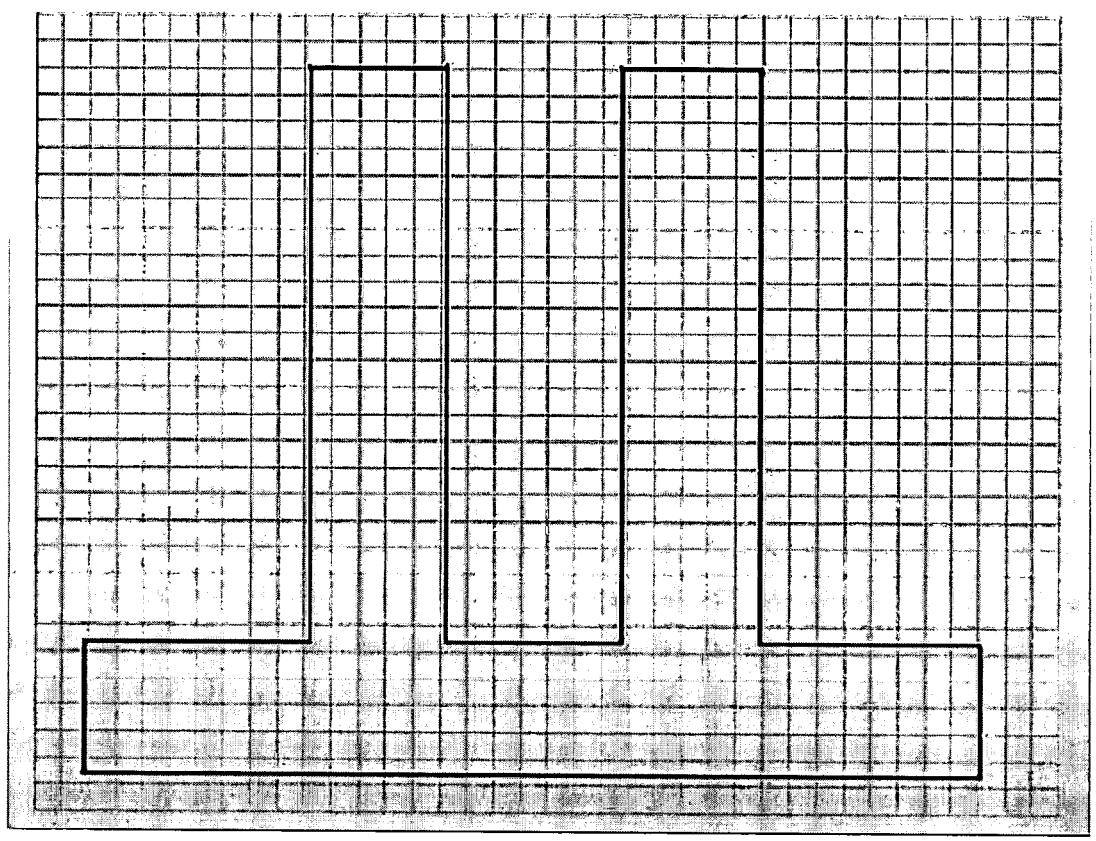
FIG. 8 depicts an exemplary section view from a 3D grid mapping result.

FIG. 8 is an exemplary section view from a 3D grid mapping result, corresponding to FIG. 7. The mapping cubes that have elements residing in them are maintained in a tree data structure for high-speed searching. Given a point in space, the tree data structure will return a corresponding mapping cube encompassing the point in an efficient manner. The searching algorithm reduces the searching problem from a n-squared order problem to a n*log(n) order problem. For example, for an array of one million objects maintained in a binary tree data structure, an object can be found in less than 8 searches.

Traversing through 3D grid mapping is illustrated in FIGS. 9-12. The spatial traversal within the 3D gird mapping topology process is as described below, with reference also to the flowchart of FIG. 13.

Figure 9:
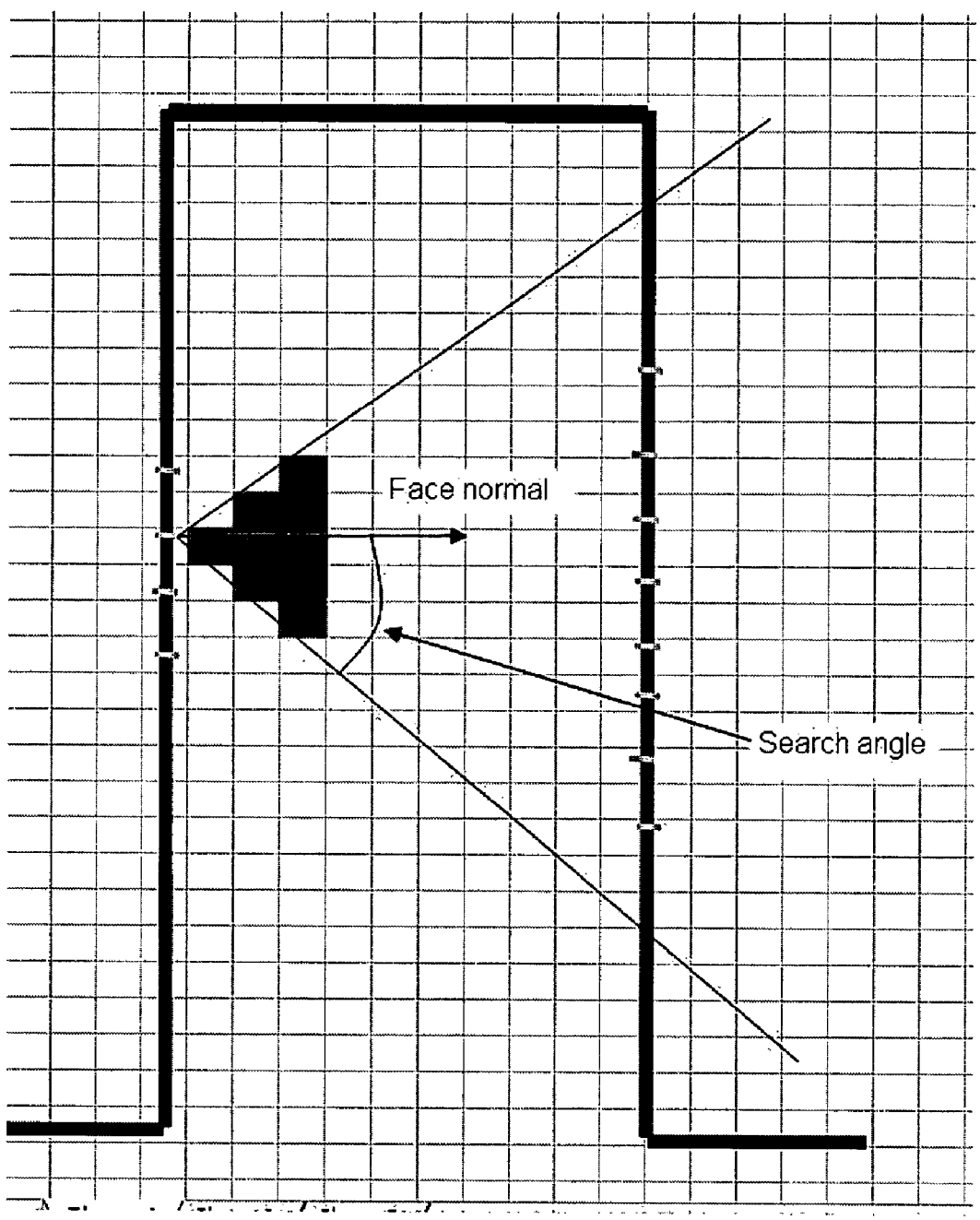
FIGS. 9-12 depict an example of traversing through a 3D grid mapping.

The traversal starts from the cube in which the first 2D surface mesh element resides (step 1305), as shown in FIG. 9.

Figure 11:
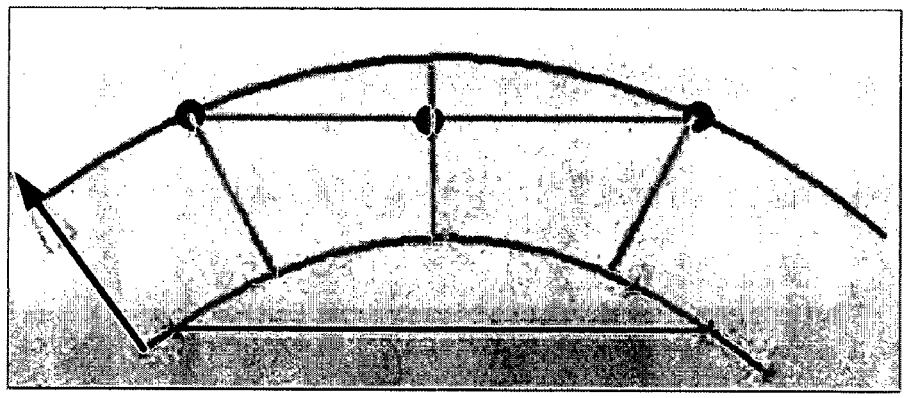

Next, for any point on the 2D surface mesh element at which the thickness is to be found, project it onto the corresponding face of the product model (step 1310). Then, find the face normal of the projected point on the face (step 1315), as shown in FIG. 11.

Figure 10:
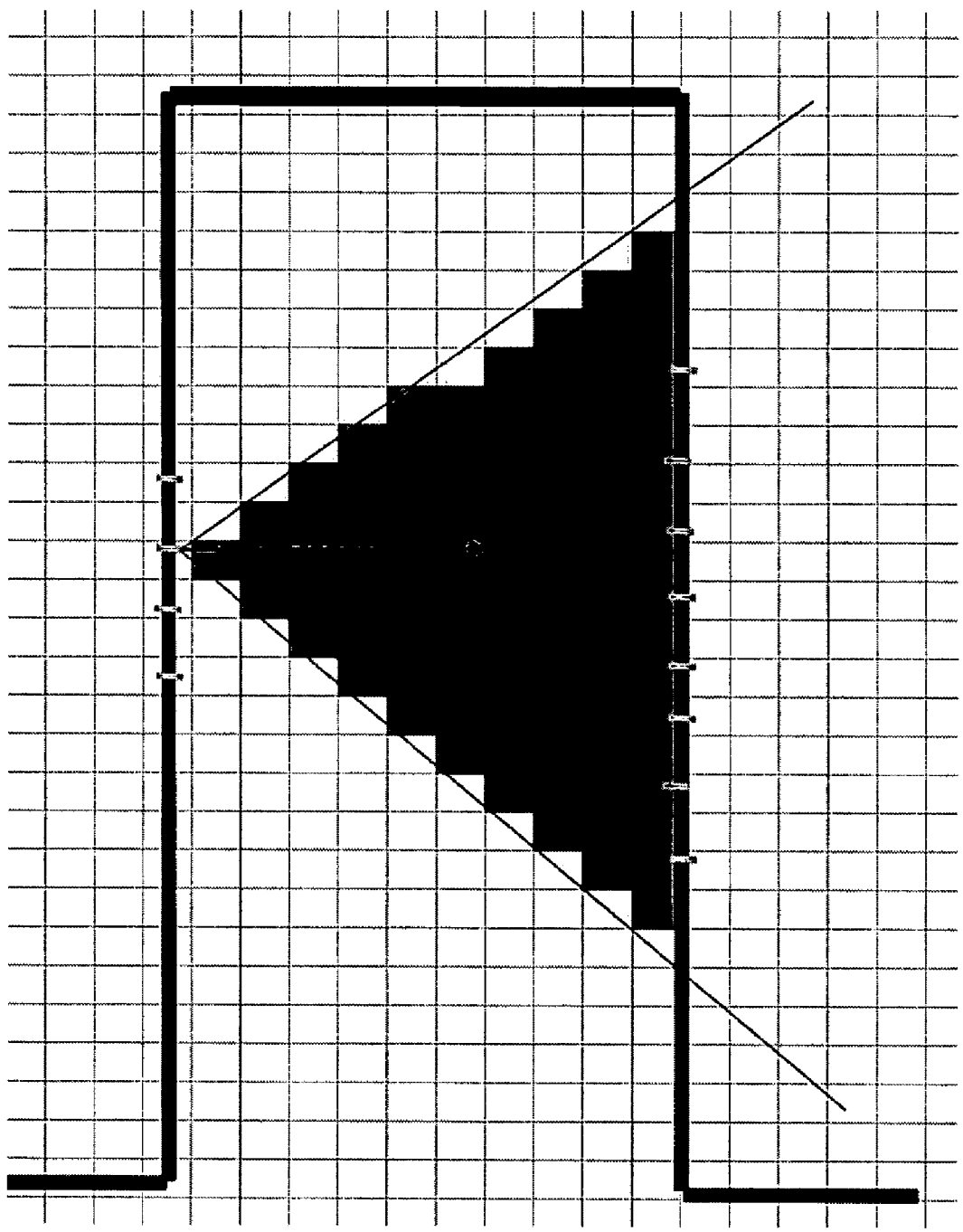

Next, guided by the face normal, and optionally a region defined by the range of angle, propagate the search for the other thickness pair element through the spatial location of the cubes (step 1320), as shown in FIGS. 9 and 10. Only the surface elements residing in the cubes within the range are included for the search. Therefore, the amount of time required for the search is greatly reduced.

Figure 12:
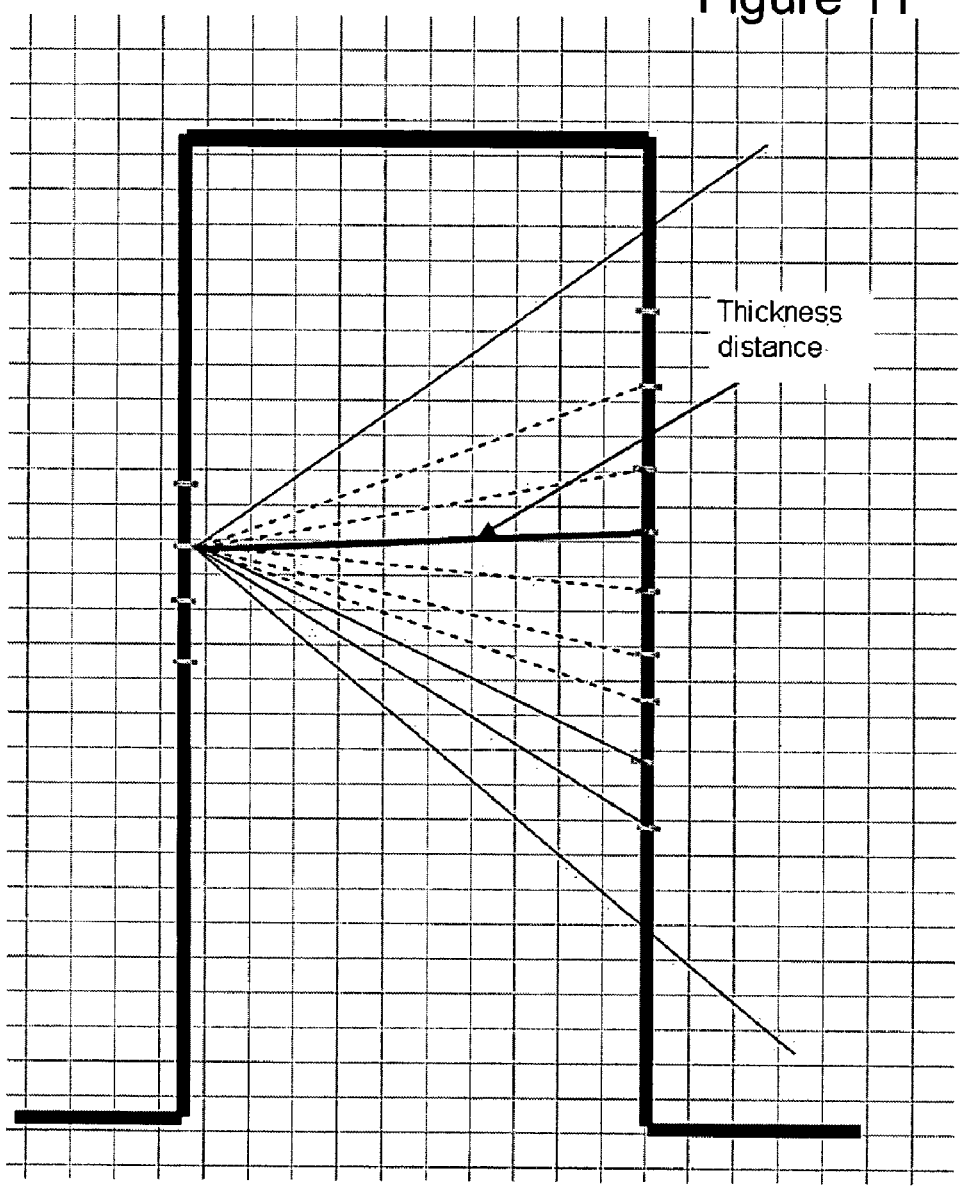
Figure 13:
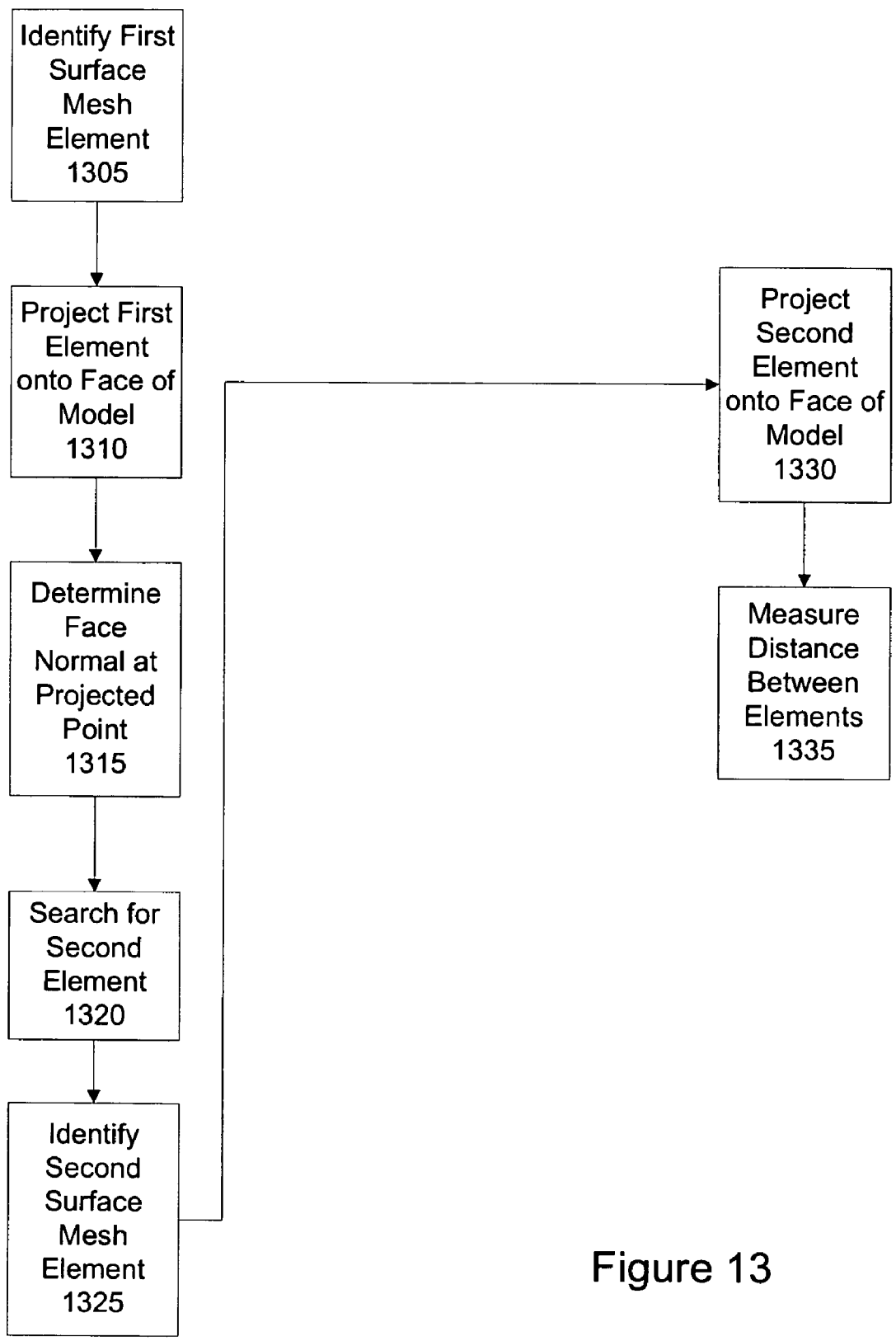
FIG. 13 depicts a flowchart of a process in accordance with a preferred embodiment.

The traversal stops when the other thickness pair element is found (step 1325). There will have to be no intersection with the other 2D surface elements for the thickness line joining the first projected point and the point on the other thickness pair element, as shown in FIG. 12.

Finally, the system will project the point found on the other thickness pair element onto the face of the product model (step 1330).

After the traverse has been made and the second element identified, the distance can be measured as described above (step 1335).

To increase accuracy even further, the system will increase the sampling points for the thickness measure.

There are two methods to increase the density of sampling points for measuring thickness, 1) increase the number of surface mesh elements by reducing the overall element size;

and 2) increase the number of sampling points within each mesh element without reducing the overall element size.

Figure 14:
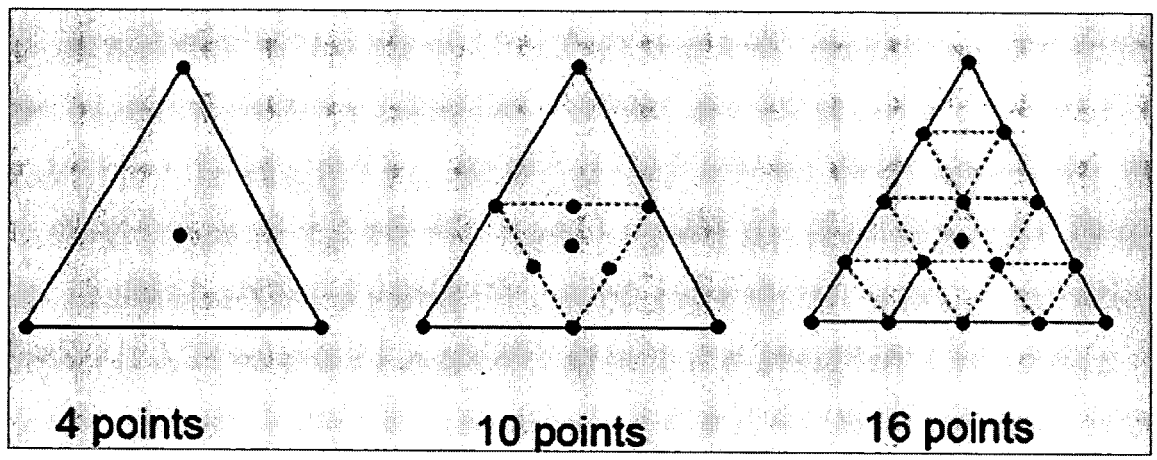
FIG. 14 depicts an example of increasing the number of sample points.

In the first method, a new surface mesh needs to be regenerated. This approach is more costly on time consumption. While the second method just adds more sampling points based on the existing mesh, it avoids regenerating mesh. FIG. 14 depicts a few of the schemes in creating more sampling points for each mesh element. The more the number of the sampling points, the more accurate the thickness results would be. The process described above is repeated to find the thickness for the new sampling points if needed.

The preferred embodiments enable a wall-thickness measurement that is much more efficient and accurate than known methods. For example, the known "Medial Axis" method for determining wall thickness calculates the medial surface using an approximation algorithm for the product body. Therefore, the method is less accurate and time consuming. In addition, the algorithm will often fail on many very complex parts.

The preferred embodiments provide methods for directly measuring the thickness between two 2D surface mesh elements of product face, so results obtained will be much more accurate. Since traversal through body internal topology in finding thickness mesh elements is used, shortest searching path is assured, and hence performance will be very high.

A significant difference between the disclosed embodiments and known techniques is that the wall thickness results determined by the disclosed process will be independent of corner area in the product model. The results from the other methods, like the medial axis approach, will be worse at corner area.

Those skilled in the art will recognize that, for simplicity and clarity, the full structure and operation of all data processing systems suitable for use with the present invention is not being depicted or described herein. Instead, only so much of a data processing system as is unique to the present invention or necessary for an understanding of the present invention is depicted and described. The remainder of the construction and operation of data processing system may conform to any of the various current implementations and practices known in the art.

It is important to note that while the present invention has been described in the context of a fully functional system, those skilled in the art will appreciate that at least portions of the mechanism of the present invention are capable of being distributed in the form of instructions contained or stored within a machine usable medium in any of a variety of forms, and that the present invention applies equally regardless of the particular type of instruction or medium utilized to actually carry out the distribution. Examples of machine usable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present invention has been described in detail, those skilled in the art will understand that various changes, substitutions, variations, and improvements of the invention disclosed herein may be made without departing from the spirit and scope of the invention in its broadest form. For example, while product models are discussed in detail herein, the disclosed techniques can be applied to any type of graphical or finite element model.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC §112 unless the exact words "means for" are followed by a participle.

What is claimed is:

1. A method for determining the thickness of a wall of a graphic model, comprising:
    identifying a first element in a surface mesh of a model;
    projecting the first element onto a face of the model to identify a first projected point;
    determining a face normal direction at the projected point;
    searching for a second element in the surface mesh of the model, guided by the face normal direction;
    identifying the second element in the surface mesh of the model;
    projecting the second element onto a face of the model to identify a second projected point; and
    determining and storing the distance between the first element and the second element.

2. The method of claim 1, wherein the searching is performed from the first element and in the face normal direction.

3. The method of claim 1, wherein the graphic model has a 3D volume meshing, tetrahedron-type internal body topology.

4. The method of claim 1, wherein the graphic model has a 3D grid mapping internal body topology.

5. The method of claim 1, further comprising adding sampling points to the surface mesh.

6. The method of claim 4, wherein the graphic model has an internal body topology represented as cubes, and the internal body topology is maintained by a tree structure to perform efficient searching.

7. A data processing system having at least a processor and accessible memory, comprising:
    means for identifying a first element in a surface mesh of a model;
    means for projecting the first element onto a face of the model to identify a first projected point;
    means for determining a face normal direction at the projected point;
    means for searching for a second element in the surface mesh of the model, guided by the face normal direction;
    means for identifying the second element in the surface mesh of the model;
    means for projecting the second element onto a face of the model to identify a second projected point; and
    means for determining and storing the distance between the first element and the second element.

8. The data processing system of claim 7, wherein the searching is performed from the first element and in the face normal direction.

9. The data processing system of claim 7, wherein the graphic model has a 3D volume meshing, tetrahedron-type internal body topology.

10. The data processing system of claim 7, wherein the graphic model has a 3D grid mapping internal body topology.

11. The data processing system of claim 7, wherein the data processing system further comprises means for sampling points to the surface mesh.

12. The data processing system of claim 7, wherein the graphic model has an internal body topology represented as cubes, and the internal body topology is maintained by a tree structure to perform efficient searching.

13. A computer program product having instructions stored in a machine usable medium, the instructions that when executed perform determining a thickness of a wall of a graphic model, the product comprising:
- instructions for identifying a first element in a surface mesh of a model;
- instructions for projecting the first element onto a face of the model to identify a first projected point;
- instructions for determining a face normal direction at the projected point;
- instructions for searching for a second element in the surface mesh of the model, guided by the face normal direction;
- instructions for identifying the second element in the surface mesh of the model;
- instructions for projecting the second element onto a face of the model to identify a second projected point; and
- instructions for determining and storing the distance between the first element and the second element.

14. The computer program product of claim 13, wherein the searching is performed from the first element and in the face normal direction.

15. The computer program product of claim 13, wherein the graphic model has a 3D volume meshing, tetrahedron-type internal body topology.

16. The computer program product of claim 13, wherein the graphic model has a 3D grid mapping internal body topology.

17. The computer program product of claim 13, further comprising instructions for adding sampling points to the surface mesh.

18. The computer program product of claim 13, wherein the graphic model has an internal body topology represented as cubes, and the internal body topology is maintained by a tree structure to perform efficient searching.

* * * * *